United States Patent
Cheng et al.

(10) Patent No.: US 11,526,020 B2
(45) Date of Patent: Dec. 13, 2022

(54) STRUCTURED LIGHT PROJECTOR AND PROJECTOR ASSEMBLY THEREOF

(71) Applicant: OmniVision Technologies, Inc., Santa Clara, CA (US)

(72) Inventors: Tingyu Cheng, New Taipei (TW); Jau-Jan Deng, Taipei (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 83 days.

(21) Appl. No.: 16/180,177

(22) Filed: Nov. 5, 2018

(65) Prior Publication Data

US 2020/0142210 A1 May 7, 2020

(51) Int. Cl.
| | | |
|---|---|---|
| *G02B 3/02* | (2006.01) | |
| *G02B 27/20* | (2006.01) | |
| *G02B 27/42* | (2006.01) | |
| *G06T 7/593* | (2017.01) | |
| *H01S 5/42* | (2006.01) | |

(52) U.S. Cl.
CPC ......... *G02B 27/20* (2013.01); *G02B 27/4205* (2013.01); *G02B 27/4272* (2013.01); *G06T 7/593* (2017.01); *H01S 5/423* (2013.01)

(58) Field of Classification Search
CPC ............ G02B 27/4205; G02B 27/4272; G02B 27/425; G02B 27/20; G02B 13/0085; G02B 13/004; G02B 13/003
USPC ................ 359/690, 784, 785, 788, 651, 663
See application file for complete search history.

(56) References Cited

U.S. PATENT DOCUMENTS

| | | | | |
|---|---|---|---|---|
| 3,030,863 | A * | 4/1962 | Schwartz | G02B 15/14 359/687 |
| 4,441,792 | A * | 4/1984 | Tateoka | G02B 13/22 359/663 |
| 5,636,065 | A * | 6/1997 | Takato | G02B 9/16 359/716 |
| 6,438,290 | B1 | 8/2002 | Bietry et al. | |
| 6,449,105 | B1 * | 9/2002 | Dou | G02B 9/10 359/717 |
| 7,544,945 | B2 | 6/2009 | Tan et al. | |
| 8,390,942 | B2 * | 3/2013 | Hsu | G02B 13/0035 359/716 |
| 10,175,493 | B1 * | 1/2019 | Chen | G02B 27/0955 |
| 2005/0078383 | A1 | 4/2005 | Jones et al. | |
| 2010/0315724 | A1 * | 12/2010 | Fukuta | B29D 11/00403 359/716 |
| 2011/0288824 | A1 * | 11/2011 | Bietry | G02B 13/16 703/1 |

\* cited by examiner

*Primary Examiner* — Audrey Y Chang
(74) *Attorney, Agent, or Firm* — Lathrop GPM LLP

(57) ABSTRACT

A projector assembly includes three coaxially aligned lenses and an aperture stop. The three coaxially aligned lenses include a first lens and, in order of increasing distance therefrom and on a same side thereof, a second lens and a positive meniscus lens. The first lens is a positive lens. The second lens is a negative lens. The second lens is located between the aperture stop and the positive meniscus lens. The projector assembly is one-sided telecentric at a plane proximate the positive meniscus lens.

9 Claims, 5 Drawing Sheets

| surface/plane | radius of curvature, mm | thickness, mm | refractive index | semi-diameter, mm | conic | 4th order term | 6th order term | 8th order term | 10th order term | 12th order term |
|---|---|---|---|---|---|---|---|---|---|---|
| surface 211 | 0.890 | 0.314 | 1.5890 | 0.624 | -0.22053 | 0.00561 | 0.01922 | -0.02904 | 0.07049 | -0.02901 |
| aperture stop 270 | | 0 | | 0.598 | | | | | | |
| surface 261 | | 0.805 | 1.5168 | 0.597 | 0 | 0 | 0 | 0 | 0 | 0 |
| surface 221 | | 0.274 | 1.6167 | 0.406 | 0 | 0 | 0 | 0 | 0 | 0 |
| surface 222 | 1.080 | 0.212 | 1.6167 | 0.331 | 5.90848 | 0.01213 | -2.77250 | 41.98462 | -412.78197 | 786.19790 |
| surface 231 | -0.964 | 0.169 | 1.6167 | 0.323 | -12.93666 | -2.72834 | 8.12506 | -77.56121 | 283.88392 | -1578.29559 |
| surface 265 | | 1.005 | 1.5168 | 0.362 | 0 | 0 | 0 | 0 | 0 | 0 |
| surface 241 | | 0.335 | 1.6167 | 0.535 | 0 | 0 | 0 | 0 | 0 | 0 |
| surface 242 | -0.843 | 0.453 | | 0.558 | -6.81117 | -1.12288 | 2.58091 | -5.42069 | 6.63359 | -3.24682 |
| plane 202 | | 0 | | 0.440 | 0 | 0 | 0 | 0 | 0 | 0 |

FIG. 3

| surface/plane 421 | radius of curvature, mm 422 | thickness, mm 423 | refractive index 424 | semi-diameter, mm 425 | conic 426 | 4th order term 404 | 6th order term 406 | 8th order term 408 | 10th order term 410 | 12th order term 412 |
|---|---|---|---|---|---|---|---|---|---|---|
| surface 211 | 0.774 | 0.316 | 1.5890 | 0.600 | -0.12422 | 0.00079 | 0.04655 | -0.22309 | 0.63459 | -0.42603 |
| aperture stop 270 | | 0 | | 0.583 | | | | | | |
| surface 261 | | 0.405 | 1.5168 | 0.583 | 0 | 0 | 0 | 0 | 0 | 0 |
| surface 221 | | 0.265 | 1.6167 | 0.457 | 0 | 0 | 0 | 0 | 0 | 0 |
| surface 222 | 1.039 | 0.343 | 1.5890 | 0.356 | 2.25666 | 0.30087 | 2.15237 | -20.46083 | 212.17383 | -163.57986 |
| surface 231 | -1.018 | 0.152 | | 0.332 | -21.55466 | -3.13727 | 13.43610 | -104.81349 | 660.80987 | -2781.78661 |
| surface 265 | | 1.305 | 1.5168 | 0.359 | 0 | 0 | 0 | 0 | 0 | 0 |
| surface 241 | | 0.332 | 1.6167 | 0.526 | 0 | 0 | 0 | 0 | 0 | 0 |
| surface 242 | -0.944 | 0.040 | | 0.547 | -14.27459 | -1.53497 | 5.37341 | -14.19775 | 21.60591 | -14.62839 |
| plane 202 | | 0.385 | | 0.510 | 0 | 0 | 0 | 0 | 0 | 0 |

FIG. 4

| surface/plane 521 | radius of curvature, mm 522 | thickness, mm 523 | refractive index 524 | semi-diameter, mm 525 | conic 526 | 4th order term 504 | 6th order term 506 | 8th order term 508 | 10th order term 510 | 12th order term 512 |
|---|---|---|---|---|---|---|---|---|---|---|
| aperture stop 270 | | 0.040 | | 0.613 | | | | | | |
| surface 211 | 0.976 | 0.299 | 1.5890 | 0.651 | -0.26753 | 0.00475 | 0.06920 | -0.32992 | 0.89071 | -0.85504 |
| surface 261 | | 0.805 | 1.5168 | 0.638 | 0 | 0 | 0 | 0 | 0 | 0 |
| surface 221 | | 0.280 | 1.6167 | 0.462 | 0 | 0 | 0 | 0 | 0 | 0 |
| surface 222 | 1.446 | 0.494 | 1.6167 | 0.391 | 3.83616 | 0.13978 | 1.49686 | -18.45088 | 161.10457 | -495.95038 |
| surface 231 | -1.081 | 0.190 | 1.6167 | 0.356 | -23.45359 | -3.06461 | 21.18197 | -203.12043 | 1087.33085 | -2807.23093 |
| surface 265 | | 0.705 | 1.5168 | 0.395 | 0 | 0 | 0 | 0 | 0 | 0 |
| surface 241 | | 0.340 | 1.6167 | 0.505 | 0 | 0 | 0 | 0 | 0 | 0 |
| surface 242 | -0.879 | 0.293 | | 0.531 | -7.19029 | -1.04267 | 2.62528 | -11.11157 | 33.34771 | -41.50986 |
| plane 202 | | 0 | | 0.442 | 0 | 0 | 0 | 0 | 0 | 0 |

FIG. 5

STRUCTURED LIGHT PROJECTOR AND PROJECTOR ASSEMBLY THEREOF

BACKGROUND

Mobile devices that are capable of using face recognition as a user authentication method are becoming more common. Face recognition potentially provides enhanced security compared to other methods, such as passcodes and finger prints. One method of face recognition includes projecting structured infrared illumination on the face of the person trying to access the device. Since users access mobile devices in environments having a broad range of temperatures, projection hardware used for face recognition should be sufficiently athermalized such that the face recognition feature is functional at a broad range of temperatures.

SUMMARY OF THE EMBODIMENTS

In a first embodiment, a projector assembly includes three coaxially aligned lenses and an aperture stop. The three coaxially aligned lenses include a first lens and, in order of increasing distance therefrom and on a same side thereof, a second lens and a positive meniscus lens. The first lens is a positive lens. The second lens is a negative lens. The second lens is located between the aperture stop and the positive meniscus lens. The projector assembly is one-sided telecentric at a plane proximate the positive meniscus lens.

In a second embodiment, a structured-light projector includes a diffractive optical element, a light source, and a projector assembly. The diffractive optical element is configured to produce structured illumination from incident illumination generated by the light source. The projector assembly is (i) located at least partially between the light source and the diffractive optical element, (ii) one-sided telecentric proximate the diffractive optical element, and (iii) configured to project the incident illumination onto the diffractive optical element.

BRIEF DESCRIPTION OF THE FIGURES

FIG. 3, FIG. 4, and FIG. 5 show, respectively, a first table, a second table, and a third table of exemplary parameters of the projector assembly of FIG. 2.

DETAILED DESCRIPTION OF THE EMBODIMENTS

Figure 1:
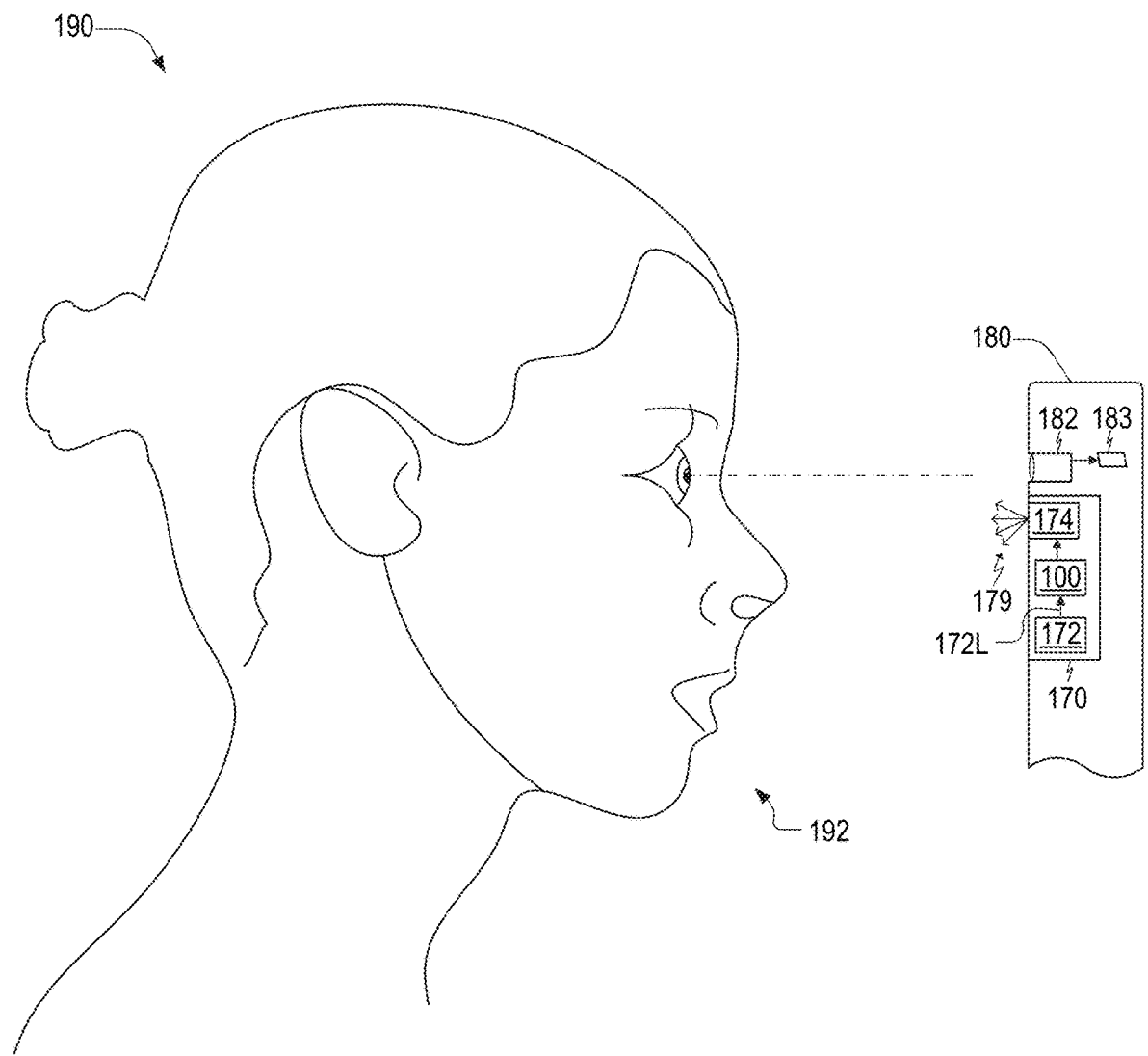
FIG. 1 illustrates a projector assembly in an exemplary use scenario as part of a structured-light projector of a mobile device, in an embodiment.

FIG. 1 illustrates a projector assembly 100 in an exemplary use scenario as part of a structured-light projector 170 of a mobile device 180. Structured-light projector 170 includes a light source 172, a diffractive optical element 174, and projector assembly 100. Mobile device 180 also includes a camera 182. Light source 172 may include at least one vertical-cavity surface-emitting laser (VCSEL).

Projector assembly 100 projects light 172L emitted by light source 172 to diffractive optical element 174, which produces structured illumination 179 that propagates toward a face 192 of a subject 190. Face 192 is in a field of view of camera 182, such that camera 182 may capture an image 183 of face 192 with structured illumination 179 thereon. Image 183 may be stored within a memory of mobile device 180. In one exemplary use scenario, mobile device 180 processes image 183 to determine if subject 190 should be allowed access to mobile device 180.

Figure 2:
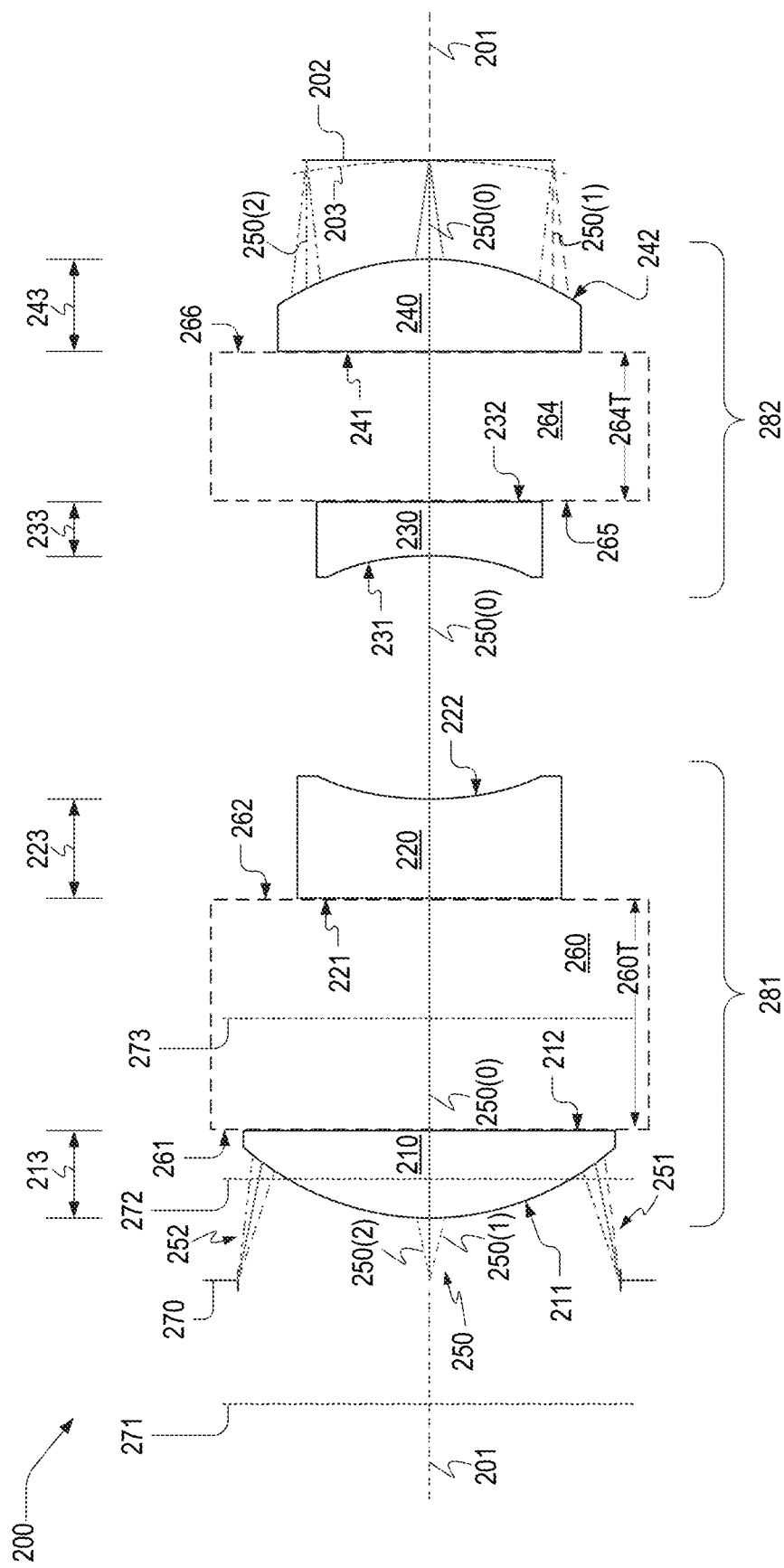
FIG. 2 is a schematic cross-sectional view of a projector assembly, which is an embodiment of the projector assembly of FIG. 1.

FIG. 2 is a schematic cross-sectional view of a projector assembly 200, which is an embodiment of projector assembly 100 of FIG. 1. Projector assembly 200 includes an aperture stop 270 and lenses 210, 220, 230, and 240. Lenses 210, 220, 230, and 240 have respective front surfaces 211, 221, 231, 241, and respective back surfaces 212, 222, 232, 242. Lenses 210, 220, 230, and 240 have a common optical axis 201 such that they are coaxially aligned.

Lens 210 may be formed of an optical glass, such as S-FTM 16 by Ohara Corporation, which has an Abbe number $V_d$=35.3. Lenses 220, 230, and 240 may be formed of an amorphous polyester material, such as OKP-4 sold by Osaka Gas Chemicals. OKP-4 has an Abbe number $V_d$=27. Lens 210 may have an Abbe number between thirty and thirty-six. Each of lens 220, 230, and 240 may have an Abbe number between twenty-five and thirty, and may be formed of a same material, which may differ from the material of lens 210.

Aperture stop 270 may be positioned along optical axis 201 (hereinafter "axially positioned") such that on optical axis 201, lens 220 is between aperture stop 270 and lens 230. For example, aperture stop 270 may be axially positioned as shown in FIG. 2, or at one of planes 271-273, each of which maybe orthogonal to optical axis 201. Lenses 210 and 220 are between plane 271 and lens 230. Plane 272 is axially positioned between surface 212 and part of surface 211 such that, on optical axis 201, lens 220 and part of lens 210 are between plane 272 and lens 230. Plane 273 is axially positioned between lens 210 and 220 such that, on optical axis 201, lens 220 is between plane 273 and lens 230. Aperture stop 270 may be directly on one of surfaces 212 and 221. A diameter of lens 210 or lens 220 may determine a diameter of the aperture stop 270.

Projector assembly 200 may also include at least one of substrates 260 and 264. Substrate 260 is between lenses 210 and 220. Substrate 264 is between lenses 230 and 240. Substrates 260 and 264 have respective front surfaces 261 and 265, and respective back surfaces 262 and 266. At least one of surfaces 261-262 and 265-266 may be planar and perpendicular to optical axis 201. One or both of substrates 260 and 264 may be formed of a photoresist, such as one formed of an epoxy resin, of which SU-8 is an example. Such substrate materials are advantageous for wafer-level manufacturing of lens assemblies such as projector assembly 200.

FIG. 2 illustrates chief rays 250, marginal rays 251, and marginal rays 252 propagating through projector assembly 200, from a plane 202 for example. With the exception of axial chief ray 250(0), FIG. 2 does not illustrate propagation of rays 250-252 between surfaces 211 and 242 for clarity of illustration. Rays 250-252 may propagate from light source 172 located at plane 202. Chief rays 250 include chief rays 250(0-2) where chief ray 250(0) is an axial chief ray and chief rays 250(1,2) are non-axial chief rays. An axial chief ray of a lens is a chief ray that propagates along the lens's optical axis. Axial chief ray 250(0) propagates along optical axis 201. Axial chief ray 250(0) may represent part of light emitted by light source 172. In an embodiment, projector assembly 200 includes light source 172 such that rays 250-252 represent light emitted therefrom at plane 202.

Projector assembly 200 may be described by parameters typically ascribed to imaging systems. In projection mode of projector assembly 200, rays 250-252 propagate from light source 172 toward aperture stop 270. Projector assembly 200 may be viewed as operating in imaging mode, where rays 250-252 propagate in the opposite direction through assembly 200: from aperture stop 270 toward an image surface 203, which is tangential to the plane 202 at optical axis 201. (Image surface 203 is a virtual surface, not an actual physical surface.) These imaging-system parameters include field curvature and distortion, the reduction of which improves fidelity of structured illumination 179 on face 192.

Projector assembly 200 may have, via image surface 203 and at a wavelength $\lambda_0$=940 nm, a field curvature magnitude less than 14.0 micrometers as a function of field angle at plane 202. At wavelength $\lambda_0$=940 nm, the distortion of projector assembly 200 may be less than 0.5 percent as a function of field angle at plane 202. The field angle ranges from zero degrees to a maximum field angle, which is 7.5 degrees, for example.

Projector assembly 200 may be one-sided telecentric at plane 202. When projector assembly 200 exhibits ideal telecentricity, each of chief rays 250(0,1,2) are normally incident on plane 202. Hence, a metric for telecentricity is the maximum deviation of chief rays 250 from said normal incidence. For field angles within ±7.5 degrees with respect to optical axis 201, projector assembly 200 may be one-side telecentric to within one-half a degree at plane 202, which means that for chief rays 250 incident on plane 202, the maximum deviation from normal incidence is less than or equal to one-half of a degree.

Thermal optical properties of lenses 210-240, e.g., temperature dependence of their refractive indices, may enable projector assembly 200 to have a focal length that is insensitive to changes in temperature. For example, when light source 172 has an emitter diameter $D_e$ and projector assembly 200 has a working f-number $N_w$, the change in focal length $\Delta f$ may be less than $N_w D_e$ as the ambient temperature varies between twenty-five and sixty degrees Celsius.

FIG. 2 designates two lens groups of projector assembly 200: lens group 281 and lens group 282. Lens group 281 includes lenses 210 and 220. Lens group 282 includes lenses 230 and 240, and may be part of, or constitute, a meniscus lens. When projector assembly 200 includes substrate 260, lens group 281 includes substrate 260.

When object-side surface 231 and image-side surface 242 are concave and convex, respectively, lenses 230 and 240 may be part of, or constitute, a meniscus lens. The meniscus lens is, for example, a positive meniscus lens when the radius of curvature $R_{242}$ of surface 242 and radius of curvature $R_{231}$ of surface 231 satisfy $|R_{242}|<|R_{231}|$. When projector assembly 200 includes substrate 264, lens group 282 includes substrate 264, which may also be part of the meniscus lens. Lens 230, substrate 264, and lens 240 may be formed of a same material and form a monolithic lens, such that lens group 282 includes a single lens that has an object-side surface 231 and an image-side surface 242.

Lenses 210, 220, 230, and 240 have respective on-axis thicknesses 213, 223, 233, and 243, where an on-axis thickness, optical path length, or distance refers to a thickness, optical path length, or distance along optical axis 201. Substrates 260 and 264 have respective on-axis thicknesses 260T and 264T along optical axis 201. Lenses 210, 220, 230, and 240 have respective on-axis optical path lengths $L_1$, $L_2$, $L_3$, and $L_4$. Lens groups 281 and 282 have respective on-axis optical path lengths $L_{281}$ and $L_{282}$. Optical path length $L_{281}$ is the optical path length, on optical axis 201, between surface 211 and surface 222. Optical path length $L_{282}$ is the optical path length, on optical axis 201, between surface 231 and surface 242.

The on-axis optical path length of an optical element depends on the thickness and refractive index of the material constituting the optical element. The aforementioned optical path lengths depend on temperature by virtue of the temperature-dependence of material constituting the optical element. Between an initial temperature $T_1$ and a final temperature $T_2$, this temperature dependence is denoted herein by adding prefix $\Delta_{12}$ to the optical path length. For example, the change in optical path length $L_1$ between temperatures $T_1$ and $T_2$ is $\Delta_{12}L_1$. Projector assembly 200 may satisfy at least one of the following optical-path-length constraints, which together enable $\Delta f$ to be less than $N_w D_e$ in a range between temperatures $T_1$ and $T_2$: (a) $\Delta_{12}L_2/\Delta_{12}L_1 > 1.91$, (b) $\Delta_{12}L_2/\Delta_{12}L_4 > 0.75$, and at temperature $T_1$, $L_{281}/L_{282} > 1.17$. Temperature $T_1$ may correspond to the temperature of light source 172 when it is off, e.g., 20° C.<$T_1$<25° C. Temperature $T_2$ may correspond to an operating temperature of light source 172, e.g., 55° C.<$T_2$<65° C.

FIG. 3 depicts a table 300 of exemplary parameters of surfaces and substrates of a first embodiment of projector assembly 200. Table 300 includes columns 304, 306, 308, 310, 312, and 321-326. Column 321 denotes surfaces of projector assembly 200. In this embodiment of projector assembly 200, aperture stop 270 is between surfaces 211 and 261.

Column 323 includes thickness values between adjacent surfaces of projector assembly 200 on optical axis 201. For example, the axial distance between surfaces 211 and 261 is 0.314 millimeters, which is the axial thickness of lens 210 in this example. Column 325 indicates the minimum diameter of each surface sufficient for a ray incident on surface 211 that passes through aperture stop 270 to also pass through that surface.

Non-planar surfaces of table 300 are defined by surface sag $z_{sag}$, shown in Eqn. 1.

$$z_{sag} = \frac{R^{-1}r^2}{1+\sqrt{1-(1+k)R^{-2}r^2}} + \sum_{i=2}^{N} \alpha_{2i} r^{2i} \quad (1)$$

In Eqn. 1, $z_{sag}$ is a function of radial coordinate r, where directions z and r are, respectively, parallel to and perpendicular to, optical axis 201. Quantity i is a positive integer and N=6. In Eqn. 1, the parameter R is the surface radius of curvature, listed in column 322 of table 300. Parameter k denotes the conic constant, shown in column 326. Columns 304, 306, 308, 310, and 312 contain values of aspheric coefficients $\alpha_4$, $\alpha_6$, $\alpha_8$, $\alpha_{10}$, and $\alpha_{12}$ respectively. The units of quantities in table 300 are consistent with $z_{sag}$ in Eqn. 1 being expressed in millimeters.

Column 324 lists values of material refractive index at free-space wavelength $\lambda_d$=587.6 nm. The refractive index corresponding to a surface characterizes the material between the surface and the surface in the row beneath. For example, the refractive index associated with surface 211 is 1.589, which is the refractive index of lens 210 in this embodiment. The on-axis optical path length between surfaces 211 and 222 is $L_{281}$=2.16 mm. The on-axis optical path length between surfaces 231 and 242 is $L_{282}$=2.34 mm. The ratio $L_{281}/L_{282}$=0.92.

FIG. 4 depicts a table 400 of exemplary parameters of surfaces and substrates of a second embodiment of projector assembly 200. Table 400 includes columns 404, 406, 408, 410, 412, and 421-426. Column 421 denotes surfaces of projector assembly 200. In this embodiment of projector assembly 200, aperture stop 270 is between surfaces 211 and 261.

Column 423 includes thickness values between adjacent surfaces of projector assembly 200 on optical axis 201. For example, the axial distance between surfaces 211 and 261 is 0.316 millimeters, which is axial thickness 213 of lens 210 in this example. Column 425 indicates the minimum diameter of each surface sufficient for a ray incident on surface 211 that passes through aperture stop 270 to also pass through that surface. Non-planar surfaces of table 400 are defined by surface sag $z_{sag}$ of Eqn. 1, where columns 404, 406, 408, 410, and 412 contain values of aspheric coefficients $\alpha_4$, $\alpha_6$, $\alpha_8$, $\alpha_{10}$, and $\alpha_{12}$ respectively.

The on-axis optical path length between surfaces 211 and 222 is $L_{281}=1.54$ mm. The on-axis optical path length between surfaces 231 and 242 is $L_{282}=2.75$ mm. The ratio $L_{281}/L_{282}=0.56$.

FIG. 5 depicts a table 500 of exemplary parameters of surfaces and substrates of a third embodiment of projector assembly 200. Table 500 includes columns 504, 506, 508, 510, 512, and 521-526. Column 521 denotes surfaces of projector assembly 200. In this embodiment of projector assembly 200, aperture stop 270 is between surfaces 211 and 261.

Column 523 includes thickness values between adjacent surfaces of projector assembly 200 on optical axis 201. For example, the axial distance between surfaces 211 and 261 is 0.299 millimeters, which is axial thickness 213 of lens 210 in this example. Column 525 indicates the minimum diameter of each surface sufficient for a ray incident on surface 211 that passes through aperture stop 270 to also pass through that surface. Non-planar surfaces of table 500 are defined by surface sag $z_{sag}$ of Eqn. 1, where columns 504, 506, 508, 510, 512, and 514 contain values of aspheric coefficients $\alpha_4$, $\alpha_6$, $\alpha_8$, $\alpha_{10}$, and $\alpha_{12}$ respectively.

The on-axis optical path length between surfaces 211 and 222 is $L_{281}=2.15$ mm. The on-axis optical path length between surfaces 231 and 242 is $L_{282}=1.93$ mm. The ratio $L_{281}/L_{282}=1.12$.

A thermal-sensitivity metric for projector assembly 200 is its change of focal length in response to a substantial temperature range. A criterion for good thermal stability is when this focal length change $\Delta f$ is less than the product of the projector assembly's working f-number $N_w$ and a diameter $D_e$ of a VCSEL, e.g., of light source 172, FIG. 1.

Each of the embodiments of FIGS. 3-5 satisfy this criterion: $\Delta f < N_w D_e$. For the embodiment of projector assembly 200 corresponding to table 300, $N_w=2.72$ and $\Delta f<15$ μm over a temperature range between 25° C. and 60° C. When $D_e=6.0$ μm, product $N_w D_e=16.3$ μm. For the embodiment of projector assembly 200 corresponding to table 400, $N_w=2.81$ and $\Delta f<13.1$ μm over a temperature range between 25° C. and 60° C. When $D_e=6.0$ μm, product $N_w D_e=16.8$ μm. For the embodiment of projector assembly 200 corresponding to table 500, $N_w=2.74$ and $\Delta f<13.8$ μm over a temperature range between 25° C. and 60° C. When $D_e=6.0$ μm, product $N_w D_e=16.4$ μm.

Combinations of Features

Features described above as well as those claimed below may be combined in various ways without departing from the scope hereof. The following enumerated examples illustrate some possible, non-limiting combinations:

(A1) A projector assembly includes three coaxially aligned lenses and an aperture stop. The three coaxially aligned lenses include a first lens and, in order of increasing distance therefrom and on a same side thereof, a second lens and a positive meniscus lens. The first lens is a positive lens. The second lens is a negative lens. The second lens is located between the aperture stop and the positive meniscus lens. The projector assembly is one-sided telecentric at a plane proximate the positive meniscus lens.

(A2) In the projector assembly (A1), the first lens and the second lens may have respective on-axis optical path lengths $L_1(T_1)$ and $L_2(T_1)$ at temperature $T_1$ and respective on-axis optical path lengths $L_1(T_2)$ and $L_2(T_2)$ at temperature $T_2$ that satisfy $|L_2(T_2)-L_2(T_1)|/|L_1(T_2)-L_1(T_1)|>1.91$. Temperature $T_1$ may be between twenty and twenty-five degrees Celsius and temperature $T_2$ being between fifty-five and eighty-five degrees Celsius (A3) In any projector assembly (A1)-(A2), the positive meniscus lens may include a third lens and a fourth lens, the third lens being negative and between the second lens and the fourth lens, the fourth lens being a positive lens.

(A4) In any projector assembly (A1)-(A3) the second lens and the fourth lens may have respective on-axis optical path lengths $L_2(T_1)$ and $L_4(T_1)$ at temperature $T_1$ and respective on-axis optical path lengths $L_2(T_2)$ and $L_4(T_2)$ at temperature $T_2$ that satisfy $|L_2(T_2)-L_2(T_1)|/|L_4(T_2)-L_4(T_1)|>0.75$. Temperature $T_1$ may be between twenty and twenty-five degrees Celsius and temperature $T_2$ being between fifty-five and eighty-five degrees Celsius.

(A5) Any projector assembly (A1)-(A5), in which the first lens and fourth lens are each plano-convex and the second lens and the third lens are each plano-concave, may further include (i) a first biplanar substrate having a first side opposite a second side, a planar surface of the first lens being disposed on a first side, a planar surface of the second lens being disposed on a second side; and (ii) a second biplanar substrate having a first side opposite a second side, a planar surface of the third lens being disposed on a first side, a planar surface of the fourth lens being disposed on a second side.

(A6) In any projector assembly (A5), in which (a) the first lens, the second lens, and the first biplanar substrate being part of a first lens group having an on-axis optical path length $L_\alpha$, and (b) the positive meniscus lens having an on-axis optical path length $L_\beta$, the ratio $L_\alpha/L_\beta$ may be less than 1.17.

(A7) In any projector assembly (A1)-(A6), the projector assembly may be one-sided telecentric such that chief rays propagating therethrough, incident on the first lens and exiting the fourth lens, are incident on the plane at an angle, with respect to normal incidence, not exceeding one-half a degree.

(A8) In any projector assembly (A7), the chief rays may be incident on the first lens at a field angle not exceeding 7.5 degrees with respect to an optical axis of the first lens.

(A9) Any projector assembly (A1)-(A8) may have a field curvature magnitude less than fourteen micrometers at field angles between −7.5 degrees and +7.5 degrees.

(A10) Any projector assembly (A1)-(A9) may have, having a distortion less than 0.5 percent at field angles between −7.5 degrees and +7.5 degrees.

(B1) A structured-light projector includes a diffractive optical element, a light source, and a projector assembly. The diffractive optical element is configured to produce structured illumination from incident illumination generated by the light source. The projector assembly is (i) located at least partially between the light source and the diffractive optical element, (ii) one-sided telecentric proximate the diffractive optical element, and (iii) configured to project the incident illumination onto the diffractive optical element.

(B2) In the structured-light projector (B1), the projector assembly may be any of the projector assemblies (A1)-(A10).

(B3) In any structured-light projector (B1)-(B2) in which the light source has a diameter $D_e$ and the projector assembly has a working f-number $N_w$, the projector assembly may have focal length that changes by less than $N_w D_e$ over a temperature range between 25° C. and 60° C.

Changes may be made in the above methods and systems without departing from the scope hereof. It should thus be noted that the matter contained in the above description or shown in the accompanying drawings should be interpreted as illustrative and not in a limiting sense. Herein, and unless otherwise indicated, the adjective "exemplary" means serving as an example, instance, or illustration. The following claims are intended to cover all generic and specific features described herein, as well as all statements of the scope of the present method and system, which, as a matter of language, might be said to fall therebetween.

What is claimed is:

1. A projector assembly comprising:
   three coaxially aligned lenses including a first lens and, in order of increasing distance therefrom and on a same side thereof, a second lens and a positive meniscus lens; and
   an aperture stop, the second lens being located between the aperture stop and the positive meniscus lens;
   the first lens being a plano-convex lens having a convex surface and, between the convex surface and the second lens, a first planar surface,
   the second lens being a plano-concave lens having a concave surface and, between the concave surface and the first lens, a second planar surface,
   the positive meniscus lens including a third lens and a fourth lens, the third lens being negative and between the second lens and the fourth lens, the fourth lens being a positive lens,
   the second lens and the fourth lens having respective on-axis optical path lengths $L_2(T_1)$ and $L_4(T_1)$ at temperature $T_1$ and respective on-axis optical path lengths $L_2(T_2)$ and $L_4(T_2)$ at temperature $T_2$ that satisfy $|L_2(T_2)-L_2(T_1)|/|L_4(T_2)-L_4(T_1)|>0.75$, the temperature $T_1$ being between twenty and twenty-five degrees Celsius and the temperature $T_2$ being between fifty-five and eighty-five degrees Celsius.

2. The projector assembly of claim 1, the first lens and the second lens having respective on-axis optical path lengths $L_1(T_1)$ and $L_2(T_1)$ at temperature $T_1$ and respective on-axis optical path lengths $L_1(T_2)$ and $L_2(T_2)$ at temperature $T_2$ that satisfy $|L_2(T_2)-L_2(T_1)|/|L_1(T_2)-L_1(T_1)|>1.91$, the temperature $T_1$ being between twenty and twenty-five degrees Celsius and the temperature $T_2$ being between fifty-five and eighty-five degrees Celsius.

3. The projector assembly of claim 1, the fourth lens being plano-convex, the third lens being plano-concave, the projector assembly further comprising:
   a first biplanar substrate having a first side opposite a second side, a planar surface of the first lens being disposed on a first side, a planar surface of the second lens being disposed on a second side; and
   a second biplanar substrate having a first side opposite a second side, a planar surface of the third lens being disposed on a first side, a planar surface of the fourth lens being disposed on a second side.

4. The projector assembly of claim 3, the first lens, the second lens, and the first biplanar substrate being part of a first lens group having an on-axis optical path length $L_\alpha$, the positive meniscus lens having an on-axis optical path length $L_\beta$, the ratio $L_\alpha/L_\beta$ being less than 1.17.

5. The projector assembly of claim 1, having a field curvature magnitude less than fourteen micrometers at field angles between −7.5 degrees and +7.5 degrees.

6. The projector assembly of claim 1, having a distortion less than 0.5 percent at field angles between −7.5 degrees and +7.5 degrees.

7. A structured-light projector comprising:
   a diffractive optical element configured to produce structured illumination from incident illumination;
   a light source configured to generate the incident illumination; and
   the projector assembly of claim 1, which projects the incident illumination to the diffractive optical element.

8. The structured-light projector of claim 7, the light source having a diameter $D_e$, the projector assembly having a working f-number $N_w$ and a focal length that changes by less than $N_w D_e$ over a temperature range between 25° C. and 60° C.

9. The projector assembly of claim 1, the only non-planar surfaces located between the second lens and the image surface being an object-side surface and an image-side surface of the meniscus lens.

* * * * *